United States Patent
Bhandarkar

(10) Patent No.: US 6,970,491 B2
(45) Date of Patent: Nov. 29, 2005

(54) PLANAR AND WAFER LEVEL PACKAGING OF SEMICONDUCTOR LASERS AND PHOTO DETECTORS FOR TRANSMITTER OPTICAL SUB-ASSEMBLIES

(75) Inventor: Sarvotham M. Bhandarkar, Plano, TX (US)

(73) Assignee: Photodigm, Inc., Richardson, TX (US)

( * ) Notice: Subject to any disclaimer, the term of this patent is extended or adjusted under 35 U.S.C. 154(b) by 32 days.

(21) Appl. No.: 10/283,730

(22) Filed: Oct. 30, 2002

(65) Prior Publication Data

US 2004/0086011 A1      May 6, 2004

(51) Int. Cl.[7] .......................... H01S 5/00; G01R 31/26; H01L 21/66; H01L 29/22
(52) U.S. Cl. ........................ 372/43; 372/50; 372/92; 372/101; 257/99; 257/101; 438/22; 438/25; 438/26
(58) Field of Search ................... 438/25, 26; 372/101, 372/43–50, 103, 92; 257/99, 101

(56) References Cited

U.S. PATENT DOCUMENTS

| | | | |
|---|---|---|---|
| 5,912,872 A * | 6/1999 | Feldman et al. ......... 369/13.32 |
| 6,243,350 B1 * | 6/2001 | Knight et al. ................ 369/126 |
| 6,433,411 B1 | 8/2002 | Degani et al. .............. 257/678 |
| 6,456,766 B1 * | 9/2002 | Shaw et al. .................... 385/47 |
| 6,669,801 B2 * | 12/2003 | Yoshimura et al. ......... 156/230 |
| 6,670,599 B2 * | 12/2003 | Wagner et al. ........... 250/214.1 |
| 6,741,777 B2 | 5/2004 | Jewell et al. .................. 385/49 |
| 6,868,207 B2 * | 3/2005 | Wickman ..................... 385/37 |
| 2004/0101020 A1 * | 5/2004 | Bhandarkar ................. 372/109 |

\* cited by examiner

Primary Examiner—Minsun Oh Harvey
Assistant Examiner—Delma R. Flores Ruiz
(74) Attorney, Agent, or Firm—Duke W. Yee; Stephen R. Tkacs

(57) ABSTRACT

A planar wafer-level packaging method is provided for a laser and a monitor photo detector. The laser and photo detector are affixed to a planar substrate. The planar substrate provides electrical connections to the components. A lens cap with a microlens is formed and affixed to the substrate with a seal. The lens cap forms a hermetically sealed cavity enclosing the laser and photo detector. The inside surface of the lens cap has a reflective coating with a central opening over the emitting aperture of the laser. The central opening has an anti-reflective coating. Light from the laser is directed and shaped by the lens cap to couple into an external light guide. Residual light from the edge of the laser reflects off the inside surface of the lens cap and is incident upon the photo detector. In an alternate method, the laser may be packaged using flip-chip assembly.

19 Claims, 12 Drawing Sheets

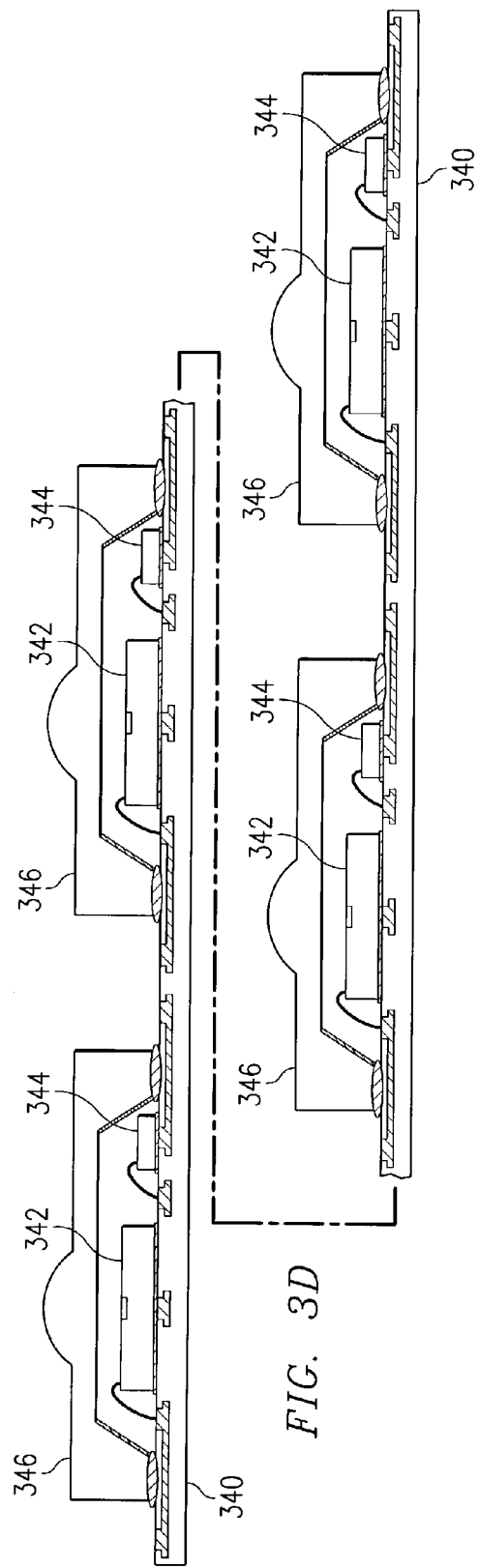
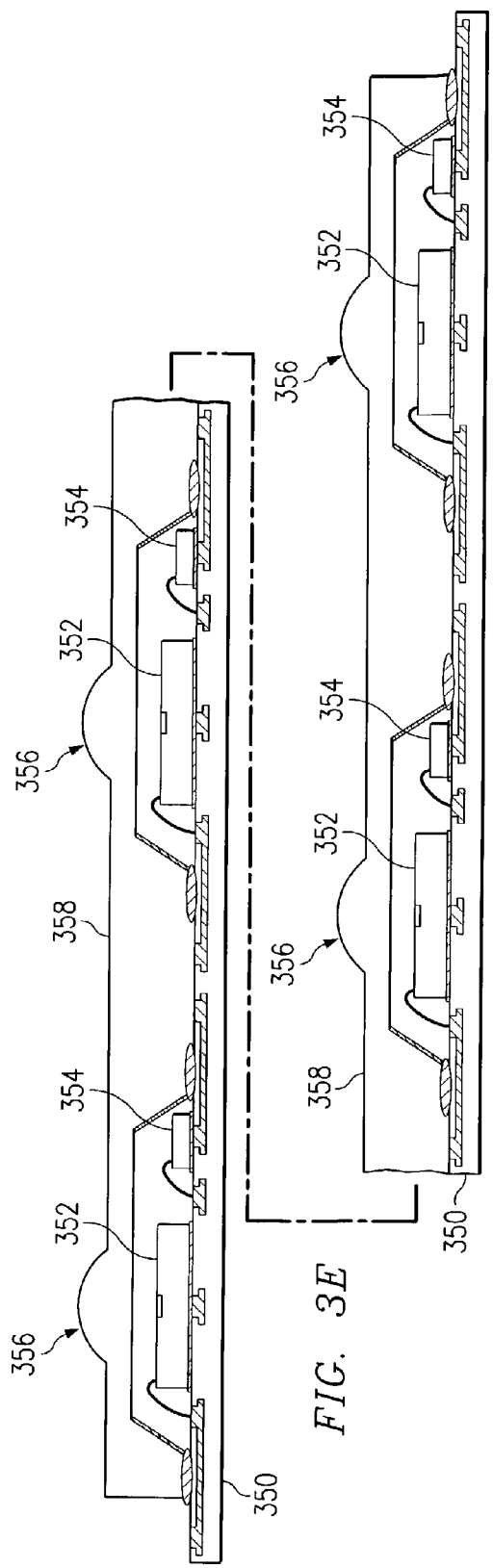
FIG. 3D
FIG. 3E

PLANAR AND WAFER LEVEL PACKAGING OF SEMICONDUCTOR LASERS AND PHOTO DETECTORS FOR TRANSMITTER OPTICAL SUB-ASSEMBLIES

BACKGROUND OF THE INVENTION

1. Technical Field

The present invention relates to lasers and, in particular, to packaging for laser assemblies. Still more particularly, the present invention provides a method and apparatus for packaging a laser and a monitor photo detector on a wafer level planar assembly.

2. Description of the Related Art

Fiber optics are used for short distance communications. A laser (Light Amplification by the Stimulated Emission of Radiation) is a device that creates a uniform and coherent light that is very different from an ordinary light bulb. Many lasers deliver light in an almost-perfectly parallel beam (collimated) that is very pure, approaching a single wavelength. Solid state lasers create ultra-high-speed, miniscule pulses traveling in optical fibers. Light traveling in an optical fiber is impervious to external interference, which is a problem with electrical pulses in copper wire.

An optical fiber is a thin glass strand designed for light transmission. A single hair-thin fiber is capable of transmitting trillions of bits per second. There are two primary types of fiber. Multimode fiber is very common for short distances and has a core diameter of from 50 to 100 microns. For intercity cabling and highest speed, singlemode fiber with a core diameter of less than 10 microns is used.

Two examples of solid-state lasers are the edge emitting laser and the vertical cavity surface emitting laser (VCSEL). VCSELs are fabricated in a chip and the laser is emitted from the surface of the chip. A VCSEL has a wavelength of about 850 mm. A VCSEL can only be used with multimode fibers. Therefore, VCSELs are limited in speed and distance. Edge emitting lasers are fabricated in a chip and the laser is emitted from the edge of the chip. An edge emitting laser has a wavelength between 1300 mm and 1550 mm. An edge emitting laser may be used with a singlemode fiber. However, edge emitting lasers present problems in packaging.

FIG. 1 illustrates an example packaging of an edge emitting laser. The top edge of laser 110 has an anti-reflective (AR) coating while the bottom edge has a highly reflective (HR) coating. Light is generated and is emitted from the top edge, as shown in FIG. 1. The light is directed through lens 120. Residual light from the bottom edge of the laser is measured by photo detector 130. Feedback from the photo detector may be used to control the laser.

As seen in FIG. 1, the packaging of the edge emitting laser is a vertical packaging. This is a difficult process to implement because the laser must be aligned with the lens and the photo detector in a vertical orientation. Furthermore, due to the vertical orientation of an edge emitting laser, the process of aligning and packaging the laser cannot be fully automated. The manufacturer of the laser must either complete the assembly of the laser product or sell the laser chip itself. If a customer buys the laser chip without an assembly, the customer must then face the challenges of aligning, packaging, and testing the laser.

Therefore, it would be advantageous to provide a method and apparatus for packaging a laser in a planar orientation.

SUMMARY OF THE INVENTION

The present invention provides a planar wafer-level packaging method for a laser and a monitor photo detector. The laser and photo detector are affixed to a planar substrate. The planar substrate provides electrical connections to the components. A lens cap with a microlens is formed. The lens cap is affixed to the substrate with a seal, such as solder. The lens cap forms a hermetically sealed cavity enclosing the laser and photo detector. The inside surface of the lens cap has a reflective coating with a central opening over the emitting aperture of the laser. The central opening has an anti-reflective coating. Light from the laser is directed and shaped by the lens cap to couple into an external light guide. Residual light from the edge of the laser reflects off the inside surface of the lens cap and is incident upon the photo detector. A plurality of such assemblies, each comprising a laser, a photo detector and a lens cap may be assembled on a single planar substrate. Alternatively a plurality of lasers and photo detectors may be assembled on the planar substrate. Next, a single substrate containing a plurality of lens caps may be aligned and affixed onto the planar substrate to complete the assembly. As yet another variation, the laser and the photo detector could each be arrays instead of single devices in the above embodiments.

In an alternate method, the laser may be packaged using flip-chip assembly. A microlens may be formed on a first side of a substrate with conductive lines and pads on a second side. Anti-reflective coating is applied on both sides of the substrate. The laser is flip-chip attached to the substrate pads using solder bumps on the second side of the substrate. Light from the laser is directed and shaped by the microlens to couple into an external light guide. The photo detector is affixed to the substrate on the second side. A cap is formed and affixed to the bottom surface of the substrate with a seal, such as solder. The inside surface of the cap has a reflective coating. Residual light from the edge of the laser reflects off the inside surface of the cap and is incident on the photo detector. The cap forms a hermetically sealed cavity enclosing the laser and photo detector. A heat sink attach material may be applied between the laser and the cap. The flip-chip design may be scaled to include a plurality of lasers and photo detectors, and also to include arrays of lasers and photo detectors.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 3A–3I are diagrams illustrating packaging of a grating-outcoupled surface emitting laser in accordance with a preferred embodiment of the present invention;

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

Figure 1:
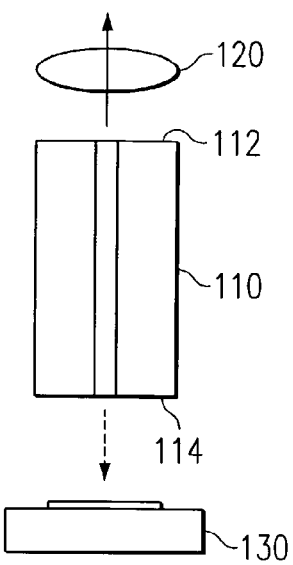
FIG. 1 illustrates an example packaging of an edge emitting laser.
Figure 2A:
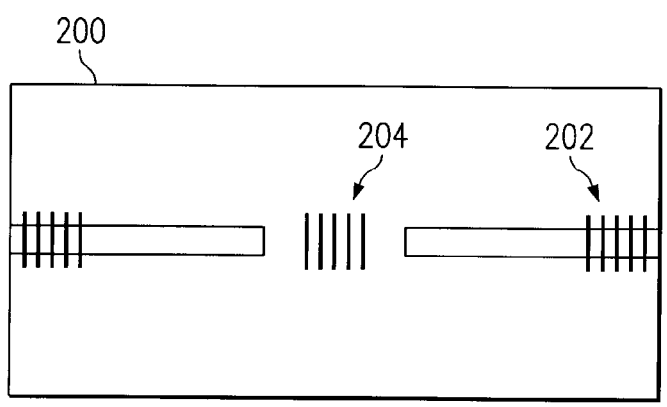
FIGS. 2A and 2B are diagrams depicting a grating-outcoupled surface emitting laser in accordance with a preferred embodiment of the present invention.
Figure 2B:
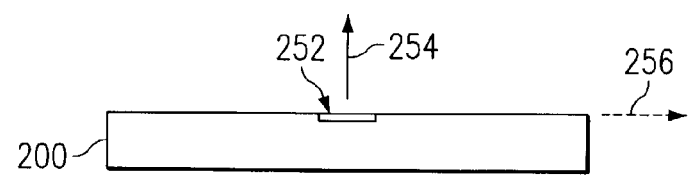

With reference now to the figures and in particular with reference to FIGS. 2A and 2B, diagrams depicting a grating-outcoupled surface emitting (GSE) laser are shown in accordance with a preferred embodiment of the present invention. Further details for the GSE laser may be found in copending patent application Ser. No. 09/844,484 to Evans et al., entitled "Grating Outcoupled Surface Emitting Lasers," filed on Apr. 27, 2001, and herein incorporated by reference.

FIG. 2A illustrates a top view of a GSE laser, which is an example of a surface emitting laser to be used in a preferred embodiment of the present invention. Laser 200 includes an outcoupling grating 204, which is located at an outcoupling aperture. On either end of the laser are located distributed Bragg reflectors (DBR) 202 for providing feedback into the cavity. Alternatively, cleaved facets may also be used instead of reflector gratings, possibly with highly reflective coatings applied to reflect the light. With either DBR reflectors or coated facets, the reflectivity of one or both ends can be varied to allow light to escape the cavity at that end.

FIG. 2B illustrates a side view of the GSE laser shown in FIG. 2A. Laser 200 includes aperture 252 through which light is emitted. In a preferred embodiment, the outcoupled light 254 is emitted normal to the surface, since one primary goal is to couple this light into a light guide such as an optical fiber. The DBR reflectors or coated facts also allow residual light 256 to escape from the edge. Residual light 256 may be measured by a photo detector to provide feedback for controlling the laser.

Figure 3A:
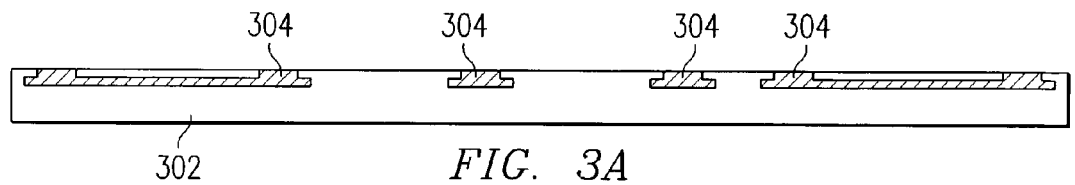

With reference now to FIGS. 3A–3I, diagrams illustrating planar packaging of a surface emitting laser are shown in accordance with a preferred embodiment of the present invention. As shown in FIG. 3A, substrate 302 is formed with conductive lines and pads 304. The conductive lines and pads provide conductive channels from inside the packaging assembly to outside the packaging assembly beneath the surface of the substrate. Substrate 302 may be a semiconductor material, such as silicon.

Figure 3B:
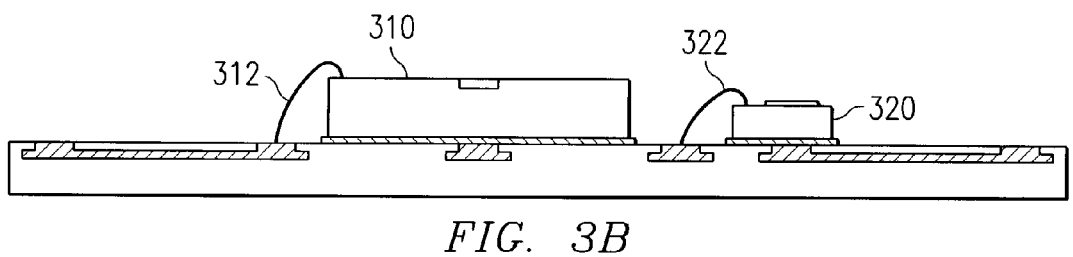

Next, as shown in FIG. 3B, laser 310 is attached to the substrate at a pad location. Conductive wire 312 couples laser 310 to a second pad. Monitor photodiode 320 is attached to the substrate at a third pad location. Conductive wire 322 couples photodiode 320 to a fourth pad. In an alternative embodiment of the present invention, a photo detector, such as photodiode 320, may be integrated into laser 310. However, for illustration in FIGS. 3A–3I, the photodiode is shown as a separate element.

Figure 3C:
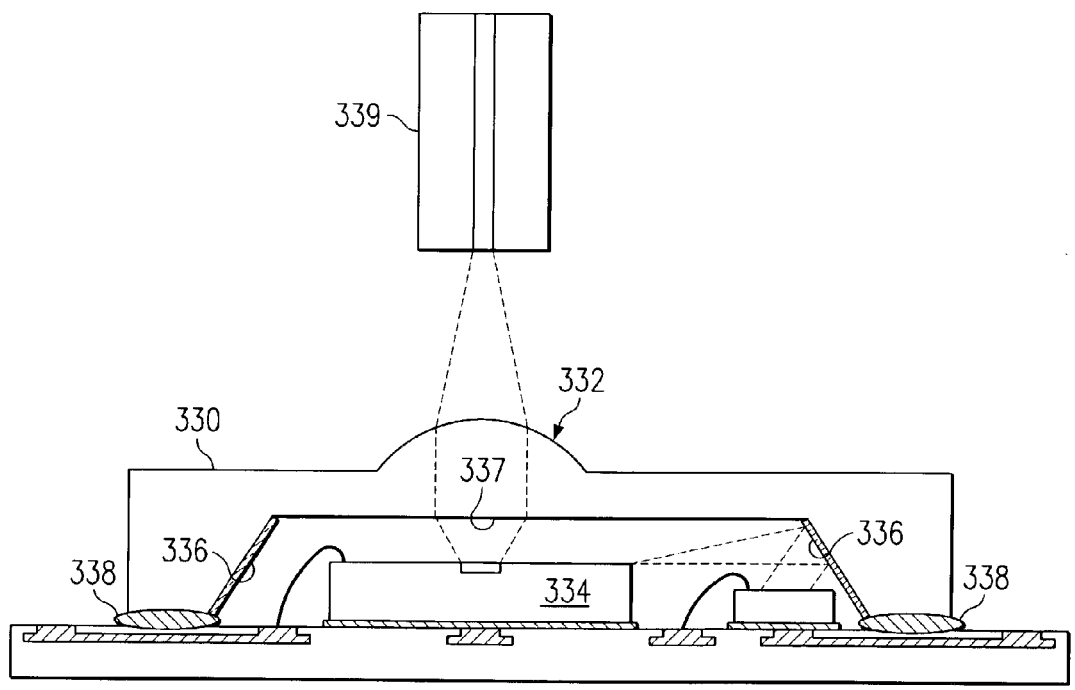

Turning next to FIG. 3C, lens cap 330 is formed with lens 332 and recess 334. Lens cap 330 is formed using known molding or semiconductor processing techniques. Whereas a variety of substrates and processing techniques may be used, in a preferred embodiment the lens cap may be formed on a silicon substrate using known grayscale masking techniques to form the lens, combined with bulk anisotropic etching of silicon to form the recess. The inside surface of the lens cap is coated with a reflective coating 336. Reflective coating 336 has a central opening over the laser aperture. The central opening may have an anti-reflective coating 337. Lens cap 330 is attached to the substrate with a seal 338, such as solder. Recess 334 forms a hermetically sealed cavity that completely encloses the laser and photo detector. The conductive lines 304 now provide electrical connections from a portion of the substrate inside the cavity to a portion of the substrate outside the cavity. Light from the surface of the laser is directed and shaped by the lens cap to couple into an external light guide 339. Residual light from the edge of the laser reflects off the inside inclined walls of the lens cap and is incident on the surface of the photo detector 320.

With reference now to FIGS. 3D–3E, diagrams illustrating a plurality of packages on the substrate are shown. As shown in FIG. 3D, a plurality of packages may be constructed on a single substrate 340 each comprising a laser 342, a photo detector 344 and a lens cap 346. FIG. 3E shows another variation in which a plurality of lasers 352 and photo detectors 354 are assembled on a first substrate 350. Next a second substrate 358 comprising a plurality of lens caps 356 may be affixed onto the first substrate to complete the assembly. As yet another variation, the laser and the photo detector could each be arrays instead of single devices, with the array running into the plane of the paper in FIGS. 3A–E.

The planar packaging depicted in FIGS. 3A–3E therefore provides a self-contained package for a surface emitting laser that: a) directs and shapes the light from the laser for the purpose of coupling into an external light guide; b) couples light from the laser into the monitor photo detector; c) provides electrical connections to the laser and photo detector; d) provides protection for the laser and photo detector from the environment. In other words, the planar wafer level package performs all the critical functions of a conventional package.

Figure 3F:
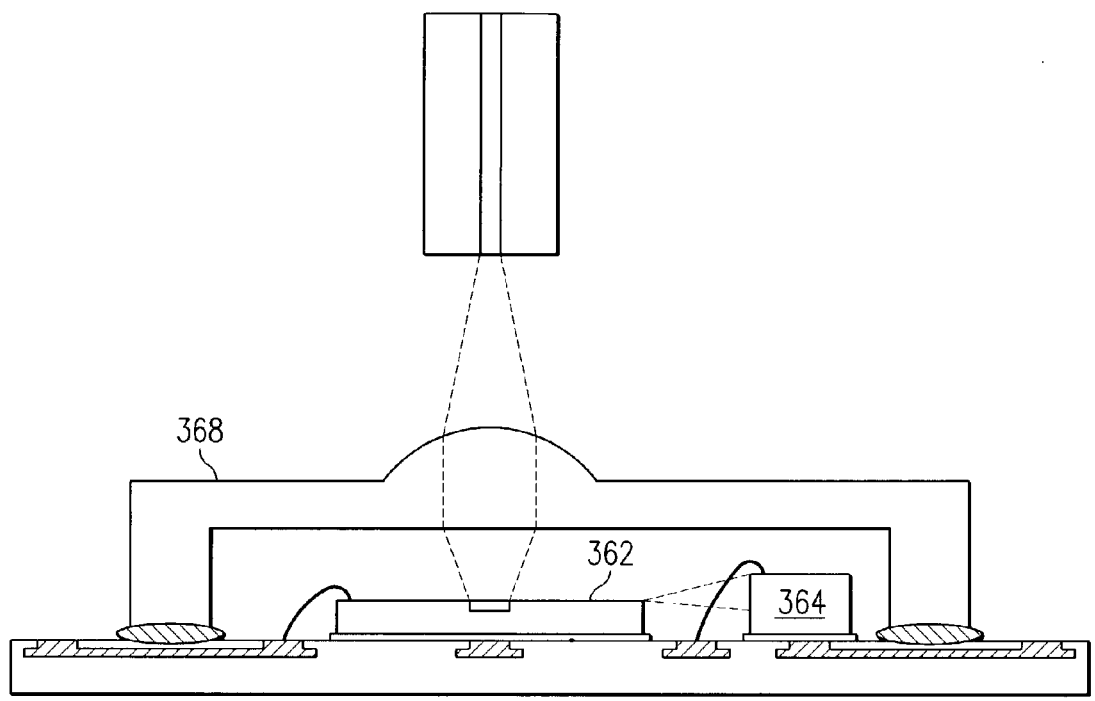
Figure 3G:
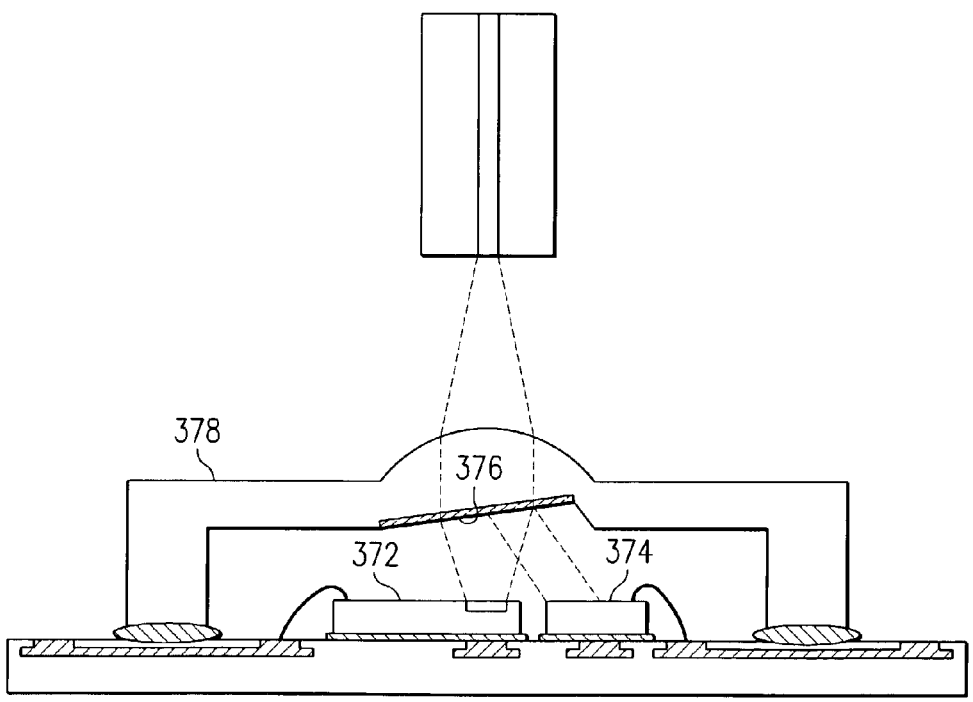

With reference now to FIGS. 3F–3G, diagrams illustrating alternate methods of coupling light from the edge of the laser into the photo detector are depicted. As shown in FIG. 3F, residual light from the edge of laser 362 is directly coupled into photo detector 364 without the need to reflect off of lens cap 368. In another embodiment, FIG. 3G, a portion 376 of lens cap 378 may be coated with a partial reflective coating. A fraction of the light emitted from the surface of laser 372 reflects off of surface 376 and is incident onto photo detector 374.

Figure 3H:
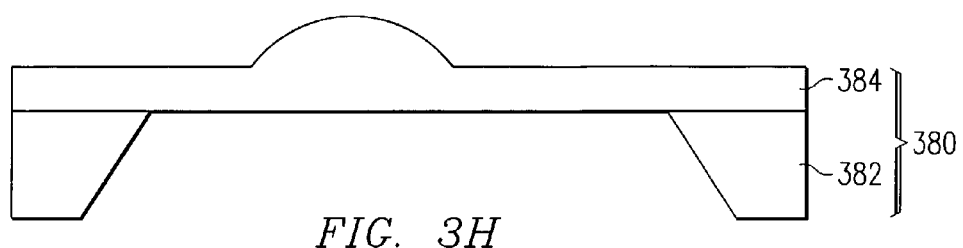
Figure 3I:
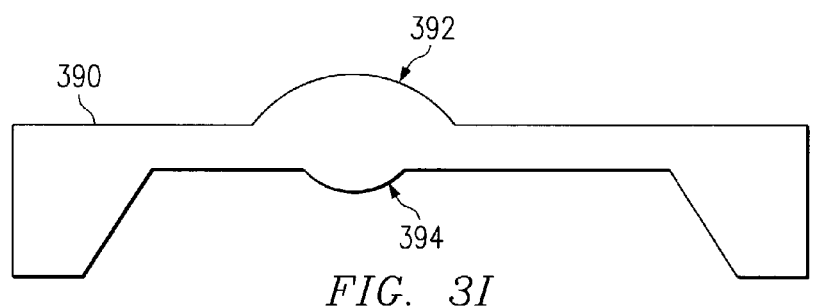

Next as shown in FIGS. 3H–3I, the lens cap may be formed in many ways, two preferred embodiments being shown. FIG. 3H shows the lens cap 380 to be formed from two separate elements, a upper half 384 and a lower half 382 being bonded together. FIG. 3I shows an embodiment of a lens cap 390 with multiple lens elements 392 and 394.

Figure 4A:
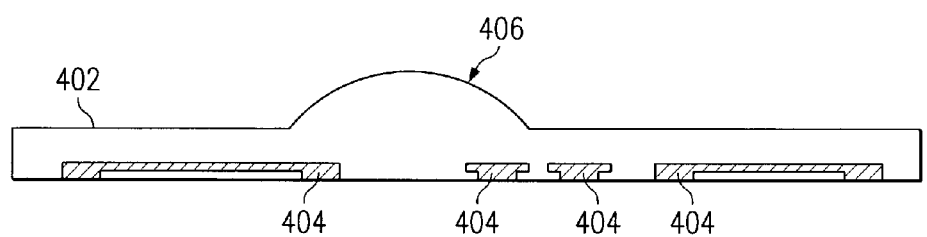
FIGS. 4A–4D are diagrams illustrating flip-chip packaging of a grating-outcoupled surface emitting laser in accordance with a preferred embodiment of the present invention.
Figure 4B:
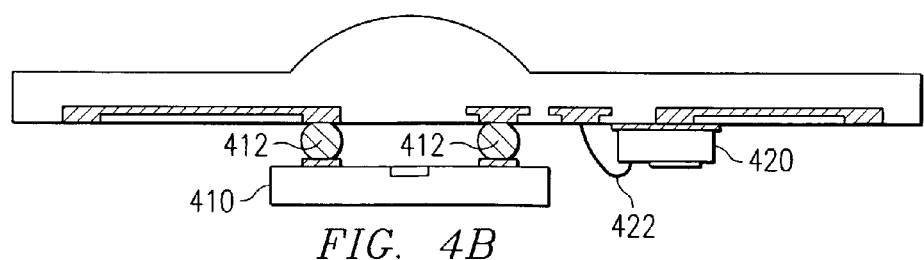
Figure 4C:
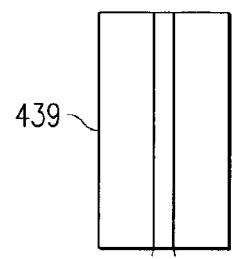
Figure 4C:
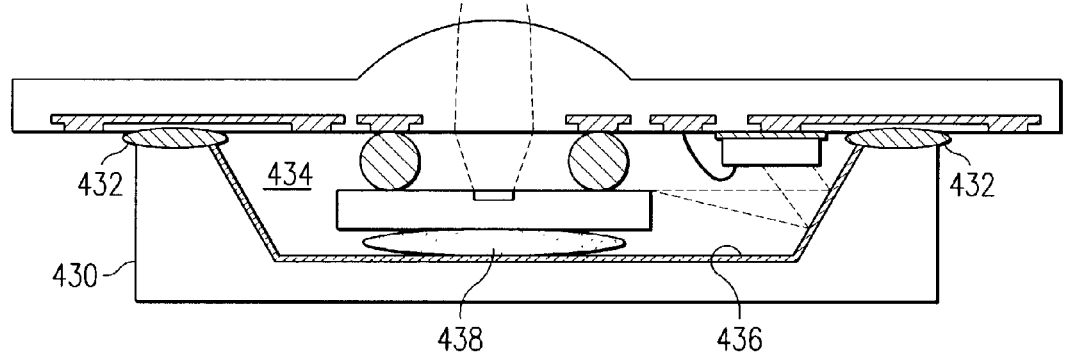

With reference now to FIGS. 4A–4C, diagrams illustrating flip-chip packaging of a surface emitting laser are shown in accordance with a preferred embodiment of the present invention. As shown in FIG. 4A, substrate 402 is formed with conductive lines and pads 404 on a bottom surface and etched with lens 406 on a top surface. The conductive lines and pads provide conductive channels from inside the packaging assembly to outside the packaging assembly beneath the surface of the substrate. Substrate 402 may be, but is not limited to, a semiconductor material, such as silicon. Conductive lines and pads 404 and lens 406 may be formed by using known semiconductor processing techniques. The lens may be formed using known molding techniques or semiconductor processing techniques. More particularly, the lens may be formed using a grayscale masking technique.

Next, as shown in FIG. 4B, laser 410 is attached to the substrate at pad locations by attaching the laser by solder bumps 412. Monitor photodiode 420 is attached to the substrate at a third pad location. Conductive wire 422 couples photodiode 420 to a fourth pad location.

Turning next to FIG. 4C, cap 430 is formed having recess 434. Cap 430 is formed using known molding or semiconductor processing techniques. The inside surface of the cap is coated with reflective surface 436. Cap 430 is attached to the substrate with a seal 432, such as solder. Recess 434 forms a hermetically sealed cavity that completely encloses the laser and the photo detector. Heatsink attach material 438 may be applied between the laser and cap 430. Light from the surface of the laser is directed and shaped by the lens to couple into an external light guide 439. Residual light from the edge of the laser reflects off the inside inclined walls of the cap and is incident on the surface of the photo detector 420.

Figure 4D:
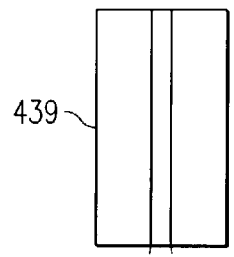
Figure 4D:
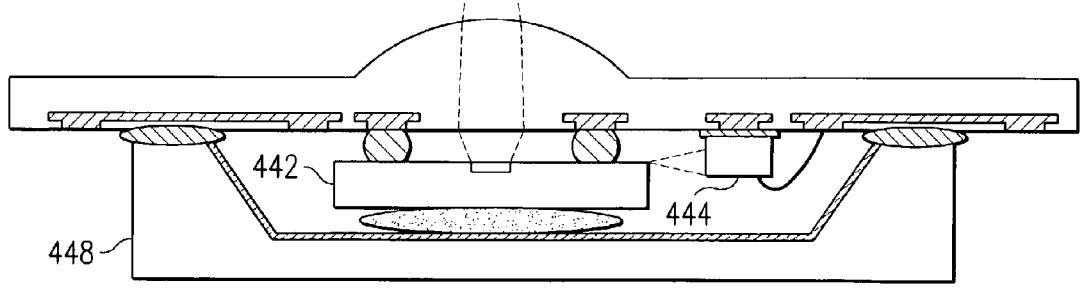

With reference now to FIG. 4D, a diagram illustrating an alternate method of coupling light from the edge of the laser into the photo detector is depicted wherein residual light from the edge of laser 442 is directly coupled into photo detector 444 without the need to reflect off of cap 448.

Similar to the planar packaging depicted in FIGS. 3D–3E, the planar packaging shown in FIGS. 4A–4D provides a self-contained package for a surface emitting laser and is easily scalable to include a plurality of individual lasers and photo detectors on a substrate as well as to arrays of lasers and photo detectors.

Figure 5A:
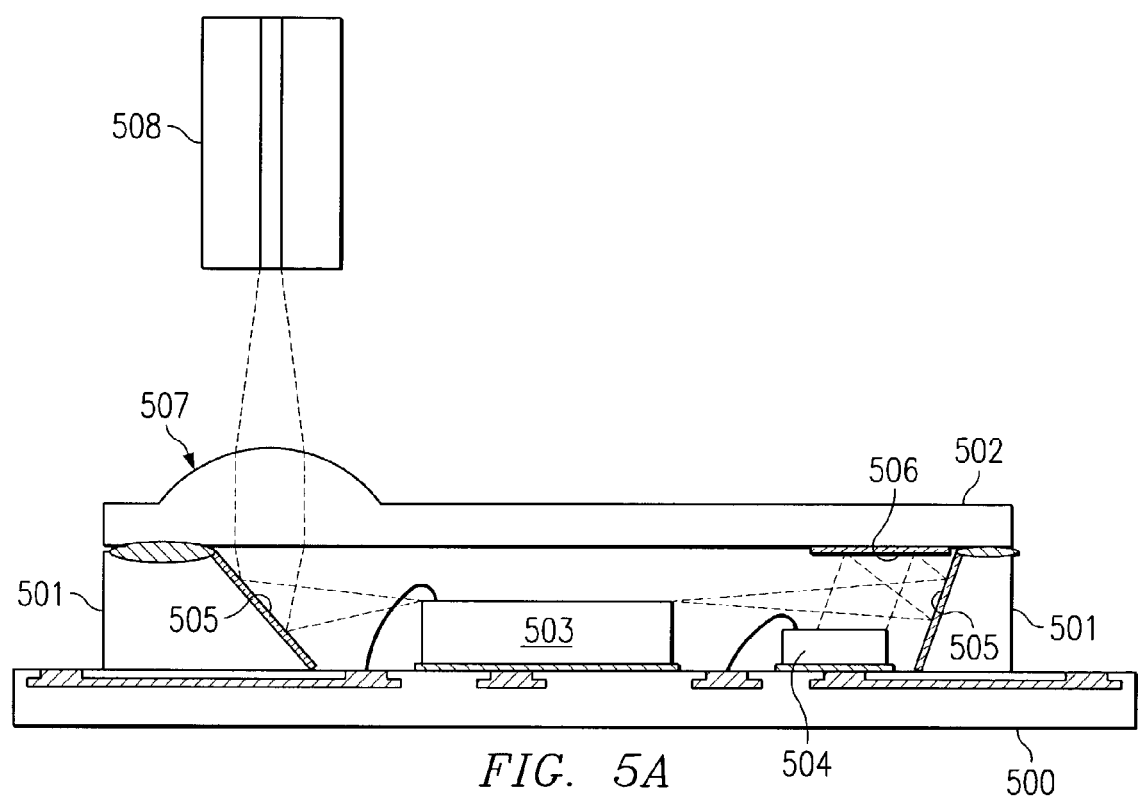
FIGS. 5A–5B are diagrams illustrating packaging of an edge emitting laser in accordance with a preferred embodiment of the present invention.
Figure 5B:
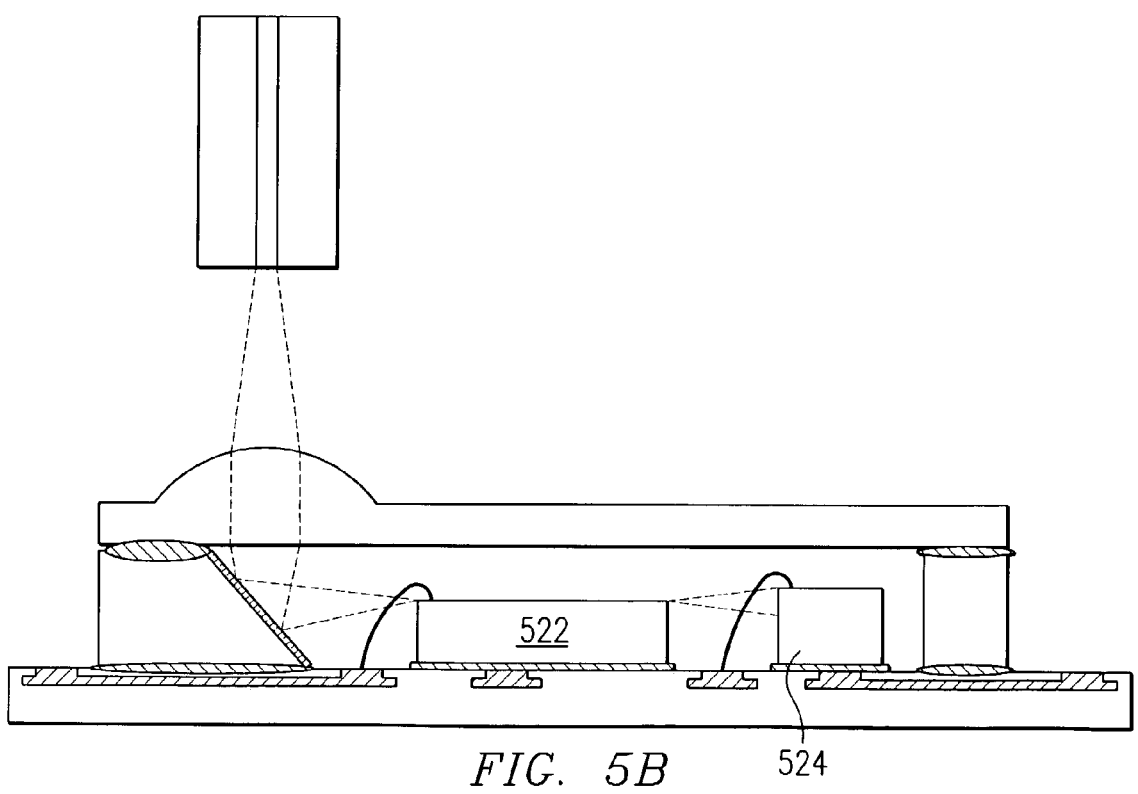

Whereas the embodiments described thus far are applicable to grating outcoupled surface emitters and conventional surface emitters (VCSELs), the following embodiments described in FIGS. 5A–5B and FIGS. 6A–6D are applicable to edge emitters. As shown in FIG. 5A, substrate 500 is hermetically bonded to interposer 501 which has on its internal walls a reflective coating 505. Edge emitter 503 and photo detector 504 are affixed on substrate 500. Next, lens cap 502 is affixed onto interposer 501. A portion of the bottom surface of lens cap 502 has applied thereon a reflective coating 506. Light from the edge of the laser 503 reflects off one reflective wall 505 and is directed and shaped by lens 507 into light guide 508. Residual light from the other edge of laser 503 reflects off surfaces 505 and 506 and is incident on the photo detector 504. FIG. 5B shows an embodiment similar to that of FIG. 5A, but with the residual light from the edge of laser 522 being directly coupled into photo detector 524.

Figure 6A:
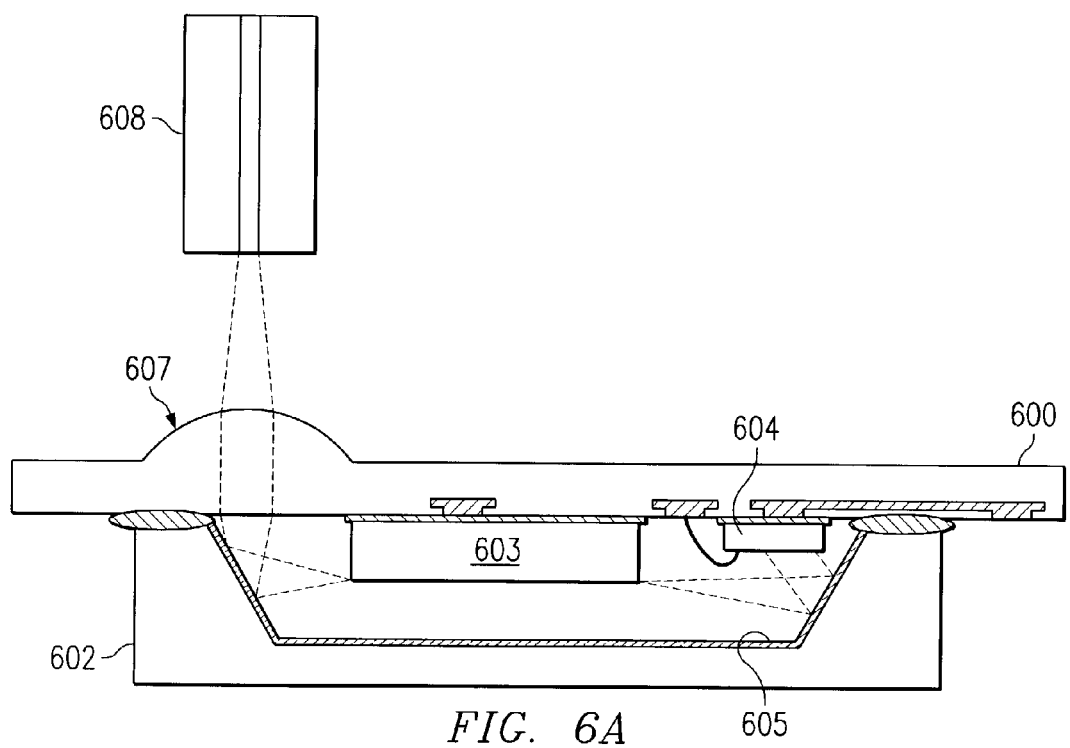
FIGS. 6A–6D are diagrams illustrating flip-chip packaging of an edge emitting laser in accordance with a preferred embodiment of the present invention.
Figure 6B:
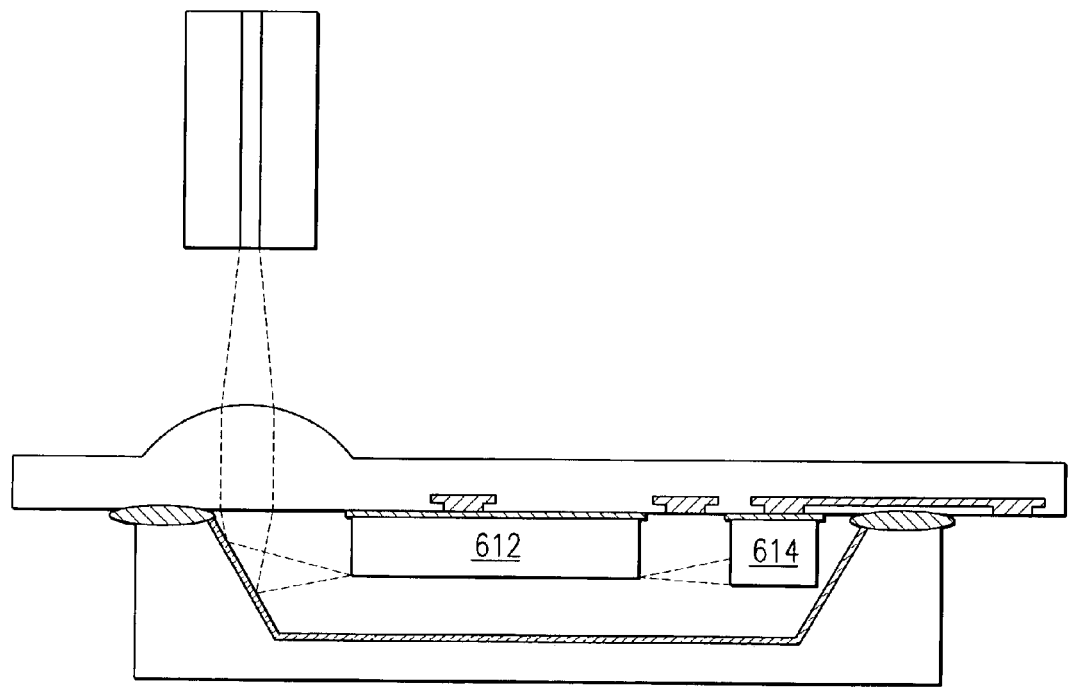
Figure 6C:
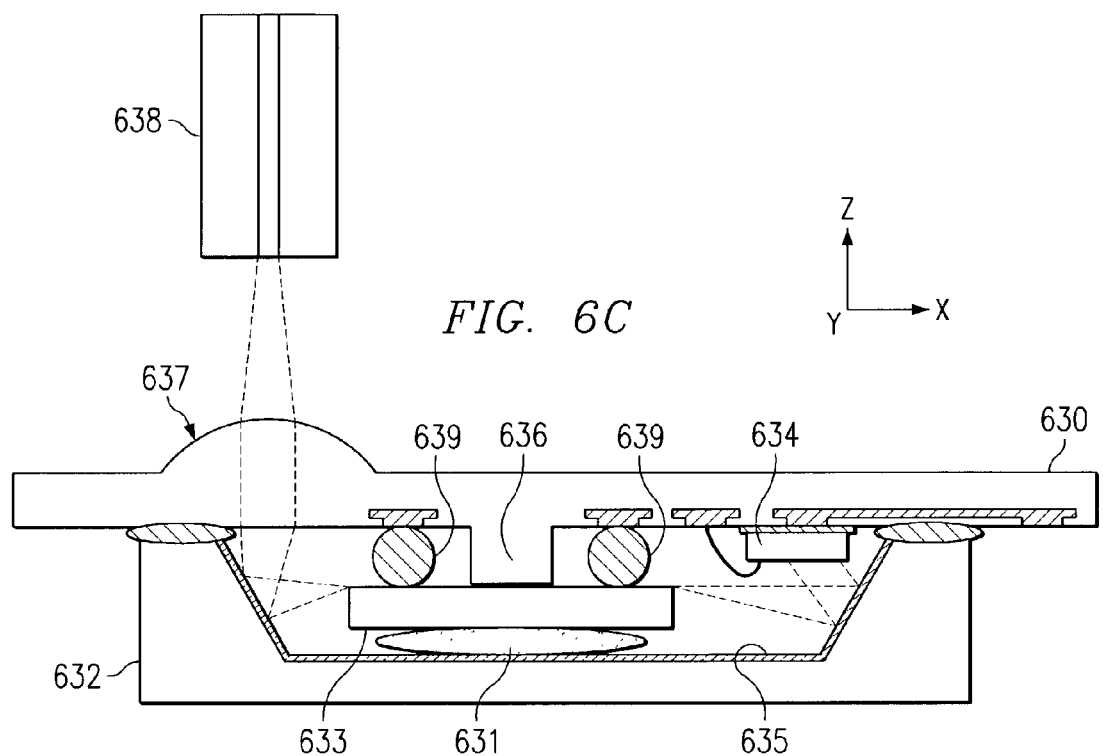
Figure 6D:
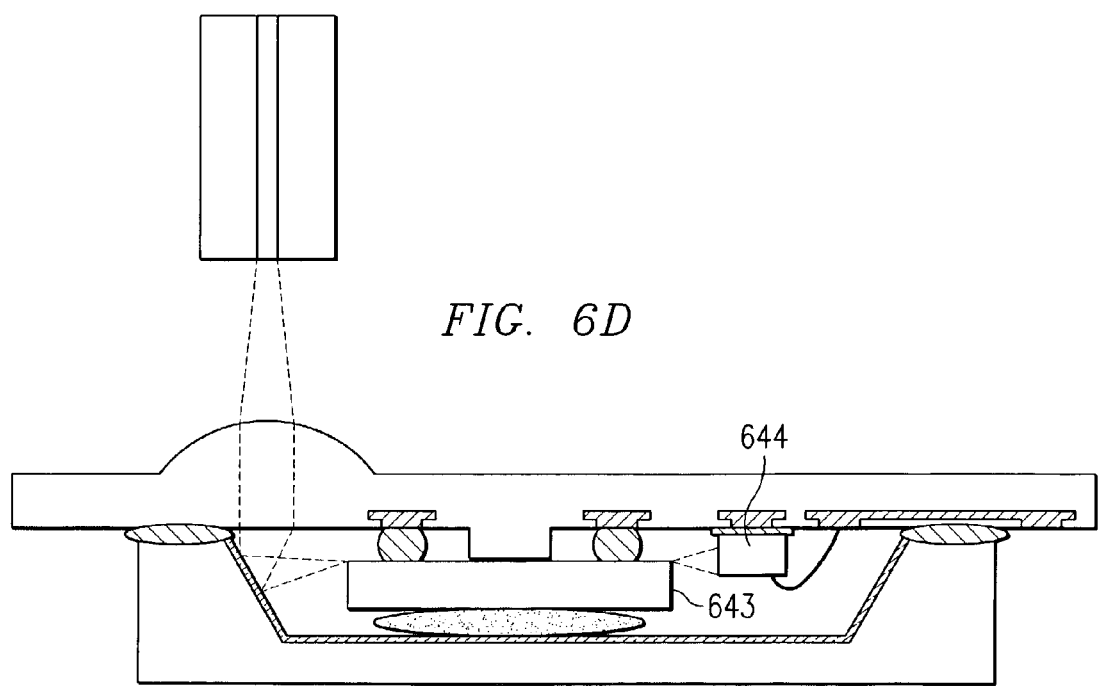

With reference now to FIGS. 6A–6D, diagrams illustrating alternate packaging of edge emitting laser are shown. As shown in FIG. 6A, substrate 600 is formed with conductive lines and pads on a bottom surface and etched with lens 607 on a top surface. Next, laser 603 and monitor photodiode 604 are attached to substrate 600. Cap 602 is formed with a reflective coating 605 applied on the inside surface. Cap 602 is affixed to substrate 600 with a hermetic seal. Light from the edge of the laser 603 reflects off of reflective wall 605 and is directed and shaped by lens 607 into light guide 608. Residual light from edge of laser 603 reflects off of reflective coating 605 and is incident on photo detector 604. FIG. 6B shows an embodiment similar to that of FIG. 6A, but with the residual light from the edge of the laser 612 being directly coupled into photo detector 614. FIG. 6C, shows an embodiment similar to FIG. 6A, but with laser 633 affixed to substrate 630 with solder bumps 639. Additionally substrate 630 has a precision standoff 636 that maintains the laser surface at a fixed height from substrate 630. Heatsink attach material 631 may be applied between laser 633 and cap 632. FIG. 6D shows another embodiment similar to that in FIG. 6C, but with photo detector 644 receiving residual light directly from laser 643.

Figure 7:
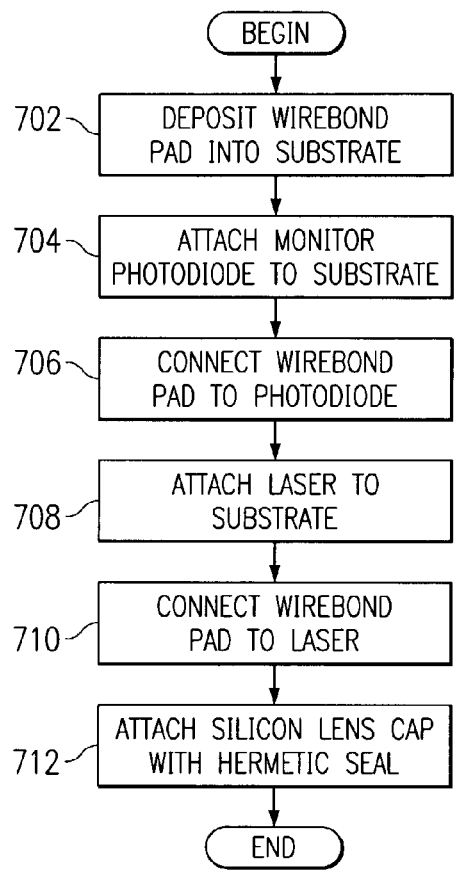
FIG. 7 is a flowchart illustrating a process for packaging a grating-outcoupled surface emitting laser in accordance with a preferred embodiment of the present invention.

With reference now to FIG. 7, a flowchart illustrating a process for packaging a surface emitting laser is shown in accordance with a preferred embodiment of the present invention. The process begins and conductive lines and pads are deposited into a substrate (step 702). Next, monitor photodiode is attached to the substrate at a pad location (step 704) and the photodiode is electrically coupled to another pad (step 706). Thereafter, the laser is attached to the substrate at a pad location (step 708) and the laser is electrically coupled to another pad (step 710). Then, a silicon lens cap is attached over the laser and the monitor photodiode with a hermetic seal (step 712) and the process ends.

Figure 8:
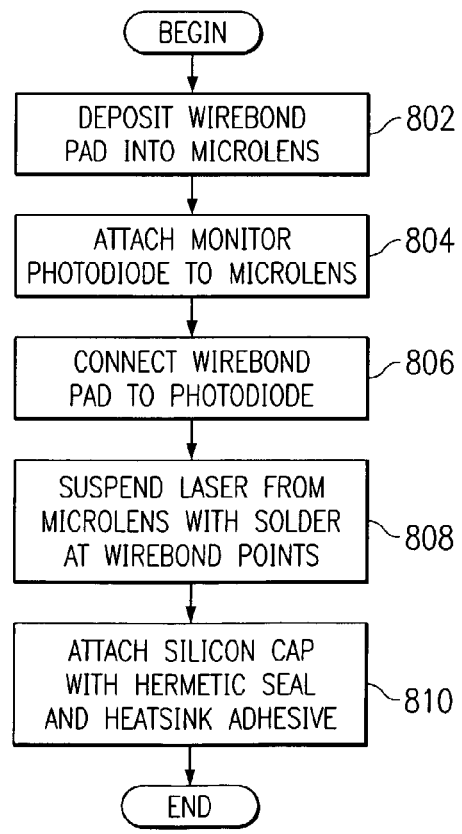
FIG. 8 is a flowchart illustrating a process for packaging a surface emitting laser using a flip-chip technique in accordance with a preferred embodiment of the present invention.

Turning now to FIG. 8, a flowchart illustrating a process for packaging a surface emitting laser using a flip-chip technique is shown in accordance with a preferred embodiment of the present invention. The process begins and conductive lines and pads are deposited into a microlens substrate (step 802). Next, monitor photodiode is attached to the substrate at a pad location (step 804) and the photodiode is electrically coupled to another pad (step 806). Thereafter, the laser is attached to the microlens substrate with solder bumps at two pad locations (step 808). Then, a silicon cap is attached over the laser and the monitor photodiode with a hermetic seal (step 810) and the process ends.

The packaging format described above is advantageous in many ways. One significant advantage is that the planar format lends itself to automated assembly using commercial pick and place equipment available in the semiconductor industry. In particular, the optical axis of the lens can be passively aligned to the optical axis of the laser beam using fiducial marks on the laser and lens cap, with commercial precision pick and place equipment. More particularly, submicron alignment precisions, required for improved coupling efficiency into singlemode light guides, can be achieved for example by using eutectic die attach and in-situ reflow on precision die attach equipment. Self-alignment forces of solder reflow may also be used as an alignment mechanism for the flip-chip method. The above methods allow for complete automation and provide much faster assembly times than the tedious active align processes used in conventional packaging.

Furthermore, multiple laser packages may be fabricated on a single substrate wafer further improving assembly throughputs by reducing handling and indexing times. Another key advantage is that the substrate wafer may be bussed on the saw streets to simultaneously energize all packages on the wafer. This enables efficient wafer-level testing and burn-in after which the packages are singulated by dicing the saw streets. The package is hermetically sealed; therefore, it can be incorporated into a laser assembly by the customer without the extra effort of aligning the lens, aligning the photo detector, and hermetically sealing the assembly. The planar package also has a much smaller vertical profile and a smaller footprint than a conventional laser assembly. Another key advantage is that the use of a silicon substrate enables the integration of drive electronics on the substrate which then becomes an enabler for high speed modulation of the laser.

Figure 9A:
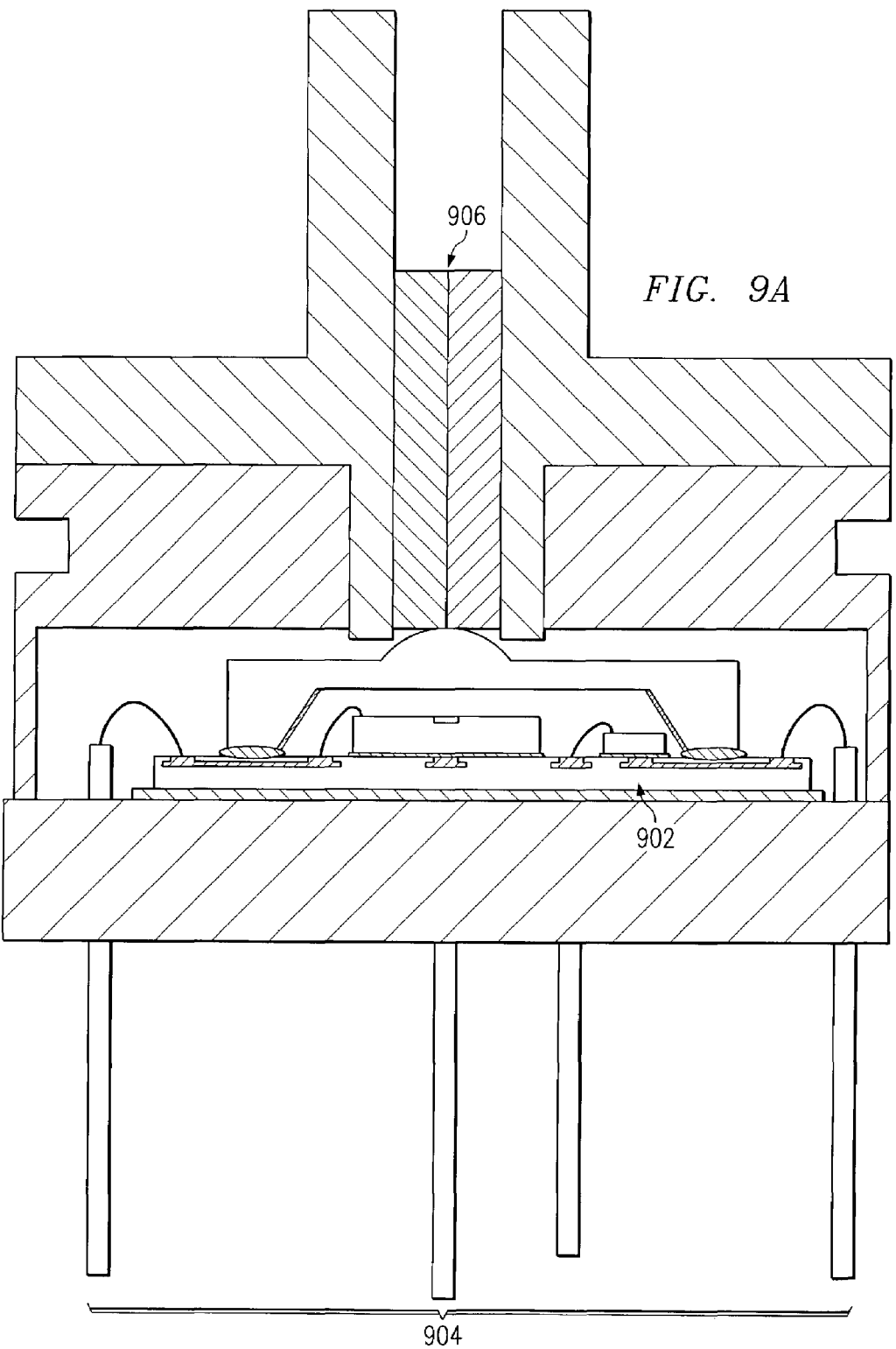
FIGS. 9A–9D are example laser assemblies incorporating the surface emitting laser packaging of the present invention.

With reference now to FIGS. 9A–9D, example laser assemblies are shown incorporating the surface emitting laser packaging of the present invention. FIG. 9A illustrates a transmitter optical sub assembly (TOSA). Laser package 902 is provided in the TOSA with current being provided by leads 904. The TOSA also has fiber 906 coupled and aligned to the laser.

Figure 9B:
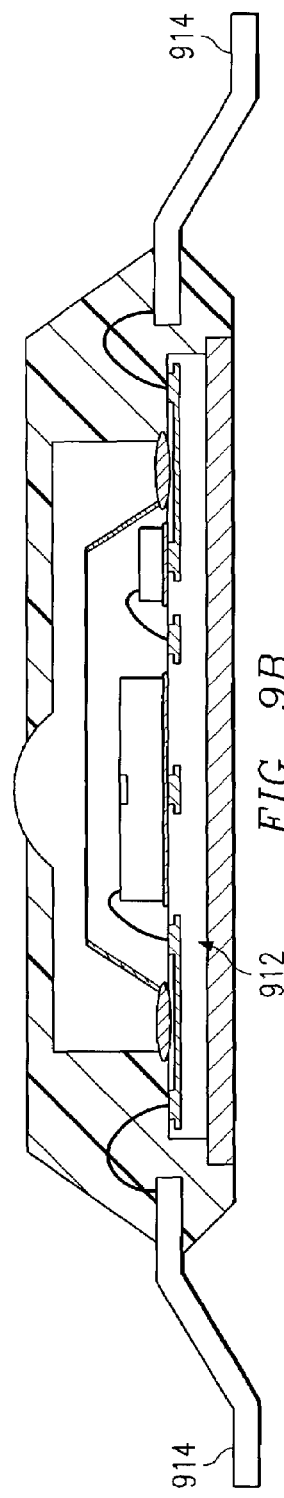
Figure 9C:
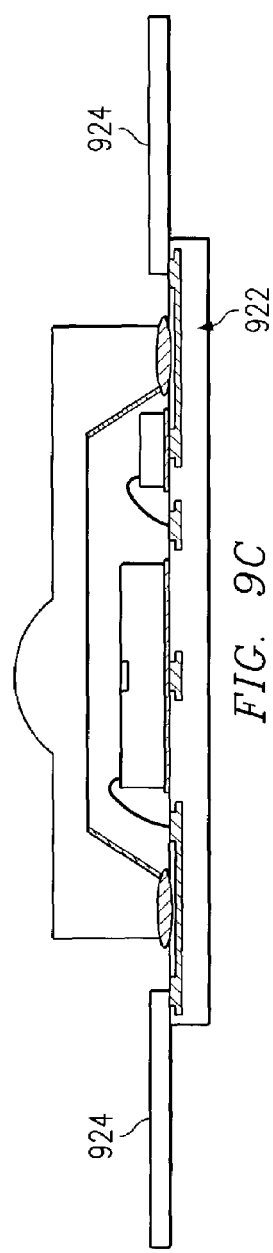
Figure 9D:
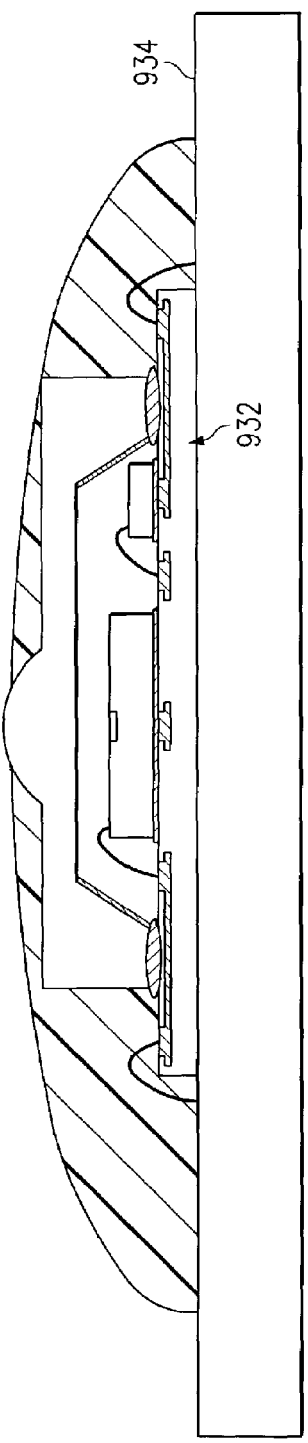

FIG. 9B illustrates a lead frame package incorporating the planar packaged surface emitting laser of the present invention. The lead frame package incorporates laser package 912 into an assembly that provides external leads 914. FIG. 9C depicts a flex tape assembly. Laser package 922 is coupled to flexible tape 924. Electrical connections are provided through conductive lines within tape 924. FIG. 9D shows a chip-on-board assembly. Laser package 932 may be attached directly to printed circuit board (PCB) 934. Electrical connections may be made from the laser package to the circuit board, making the communications between circuitry on the PCB and the laser package more efficient.

Thus, the present invention solves the disadvantages of the prior art by providing planar packaging for lasers. The alignment and assembly of components in the package is accomplished in a passive manner and therefore may be virtually fully automated using machine vision. Therefore, the packages may be manufactured at a higher volume more reliably and at a lower cost. The use of a silicon substrate enables the integration of drive electronics close to the laser thereby enabling high modulation speeds. The compact planar package has equal or better coupling efficiency. Furthermore, the package is hermetic at the substrate wafer level, thus enabling wafer-level testing and burn-in. Many laser packages may be fabricated on a substrate wafer and testing and burn-in may be performed on all packages on the substrate wafer at one time. Also, a key advantage of this is that subsequent assemblies or packages, such as precision molded TOSA or small outline integrated circuit (SOIC) may be non-hermetic. The planar package of the present invention provides a standard subassembly or subpackage, thus simplifying assembly, testing, burn-in, etc. The subassembly of the present invention may be simply dropped into a customer-specific package in one final assembly step, saving the customer the additional steps of performing tedious alignment, sealing, testing, and burn-in tasks.

What is claimed is:

1. A method for packaging a surface emitting laser, the method comprising:
   attaching a laser to a first substrate, wherein the laser emits a laser beam from a surface of the laser;
   attaching a photo detector to the first substrate, wherein the photo detector receives light from the laser; and
   attaching a second substrate to the first substrate, wherein the first substrate and the second substrate enclose the laser and the photo detector in a cavity,
   wherein one of the first substrate and the second substrate includes at least one lens element,
   wherein the at least one lens element is constructed and positioned with respect to the laser to shape and direct the laser beam into a light guide,
   wherein the step of attaching the photo detector to the substrate includes aligning the photo detector so that the photo detector receives light from an edge of the laser, and
   wherein the step of aligning the photo detector includes aligning the photo detector so that the photo detector receives light directly from the edge of the laser.

2. A method for packaging a surface emitting laser, the method comprising:
   attaching a laser to a first substrate, wherein the laser emits a laser beam from a first edge of the laser;
   attaching a photo detector to the first substrate, wherein the photo detector receives light from the laser;
   attaching an interposer to the first substrate; and
   attaching a second substrate to the interposer, wherein the first substrate, the interposer, and the second substrate enclose the laser and the photo detector in a cavity and wherein the cavity is heretically sealed,
   wherein one of the first substrate and the second substrate includes at least one lens element,
   wherein the at least one lens element is constructed and positioned with respect to the laser to receive the laser beam from the first edge of the laser via reflection from an inside surface of the interposer and to shape and direct the laser beam into a light guide,
   wherein the step of attaching the photo detector to the first substrate includes aligning the photo detector so that the photo detector receives light directly from a second edge of the laser.

3. The method of claim 2, wherein the step of aligning the photo detector includes aligning the photo detector so that the photo detector receives light directly from the second edge of the laser.

4. The method of claim 2, wherein the step of aligning the photo detector includes aligning the photo detector so that the photo detector receives light from the second edge of the laser via reflection from an inside surface of the interposer.

5. A laser assembly, comprising:
   a first substrate, wherein the first substrate has formed therein a lens element on a top surface;
   a second substrate; and
   a laser attached to the second substrate, wherein the laser emits a laser beam through an aperture on a surface of the laser; and
   a photo detector attached to the second substrate, wherein the photo detector receives light from the laser,
   wherein the first substrate and the second substrate form a hermetically sealed cavity enclosing the laser, and
   wherein the lens element directs and shares the laser beam into a light guide
   wherein the photo detector receives light directly from an edge of the laser.

6. The laser assembly of claim 5, wherein the photo detector is enclosed within the cavity.

7. The laser assembly of claim 5, wherein the lens element is positioned above the aperture.

8. A laser assembly, comprising:
   a first substrate;
   a second substrate; and
   a laser attached to the second substrate, wherein the laser emits a laser beam through an aperture on a surface of the laser,
   wherein one of the first substrate and the second substrate has formed therein a lens element, wherein the first substrate and the second substrate form a hermetically sealed cavity enclosing the laser, and wherein the lens clement directs and shaves the laser beam into a light guide, wherein the second substrate has formed therein the lens element on a top surface of the second substrate a photo detector attached to the second substrate, wherein the photo detector receives light directly from the laser.

9. The laser assembly of claim 8, wherein the laser is attached to the second substrate on a bottom surface of the second substrate.

10. The laser assembly of claim 9, wherein a heatsink attach material is applied between the laser and the first substrate.

11. The laser assembly of claim 9, wherein the laser is attached using flip-chip.

12. The laser assembly of claim 8, wherein the photo detector is enclosed within the cavity.

13. The laser assembly of claim 8, wherein the first substrate has a reflective coating on a top surface.

14. The laser assembly of claim 13, wherein the photo detector receives light from an edge of the laser via reflection from the reflective coating.

15. The laser assembly of claim 8, wherein the photo detector receives light directly from an edge of the laser.

16. The method of claim 1, wherein the light guide is an optical fiber.

17. The method of claim 2, wherein the light guide is an optical fiber.

18. The laser assembly of claim 5, wherein the light guide is an optical fiber.

19. The laser assembly of claim 8, wherein the light guide is an optical fiber.

* * * * *

UNITED STATES PATENT AND TRADEMARK OFFICE
CERTIFICATE OF CORRECTION

PATENT NO. : 6,970,491 B2
APPLICATION NO. : 10/283730
DATED : November 29, 2005
INVENTOR(S) : Bhandarkar It is certified that error appears in the above-identified patent and that said Letters Patent is hereby corrected as shown below:

Col. 8, line 21: after "cavity is" delete "heretically" and insert --hermetically--.

Col. 8, line 52: after "directs and" delete "shares" and insert --shapes--.

Col. 9, line 3: after "lens" delete "clement directs and shaves" and insert --element directs and shapes--.

Signed and Sealed this

Eighteenth Day of July, 2006

JON W. DUDAS
*Director of the United States Patent and Trademark Office*